(12) United States Patent
Kouno et al.

(10) Patent No.: US 10,068,790 B2
(45) Date of Patent: Sep. 4, 2018

(54) ELECTROSTATIC CHUCK DEVICE

(71) Applicant: SUMITOMO OSAKA CEMENT CO., LTD., Tokyo (JP)

(72) Inventors: Hitoshi Kouno, Tokyo (JP); Fumihiro Gobou, Tokyo (JP)

(73) Assignee: SUMITOMO OSAKA CEMENT CO., LTD., Tokyo (JP)

( * ) Notice: Subject to any disclaimer, the term of this patent is extended or adjusted under 35 U.S.C. 154(b) by 0 days.

(21) Appl. No.: 15/515,083

(22) PCT Filed: Sep. 9, 2015

(86) PCT No.: PCT/JP2015/075612
§ 371 (c)(1),
(2) Date: Mar. 28, 2017

(87) PCT Pub. No.: WO2016/052115
PCT Pub. Date: Apr. 7, 2016

(65) Prior Publication Data
US 2017/0243778 A1     Aug. 24, 2017

(30) Foreign Application Priority Data

Sep. 30, 2014   (JP) ................................. 2014-201304

(51) Int. Cl.
*H01L 21/683* (2006.01)
*H01L 21/67* (2006.01)

(52) U.S. Cl.
CPC .... *H01L 21/6833* (2013.01); *H01L 21/67103* (2013.01)

(58) Field of Classification Search
CPC ...................... H01L 21/6833; H01L 21/67103
See application file for complete search history.

(56) References Cited

U.S. PATENT DOCUMENTS

| 2008/0102209 A1 | 5/2008 | Sasaki et al. |
| 2009/0056112 A1* | 3/2009 | Kobayashi ............. H02N 13/00 29/739 |

FOREIGN PATENT DOCUMENTS

| JP | 2002-329776 A | 11/2002 |
| JP | 2003-086664 A | 3/2003 |

(Continued)

OTHER PUBLICATIONS

International Search Report for PCT/JP2015/075612 (dated Nov. 17, 2015).

(Continued)

*Primary Examiner* — Scott Bauer
(74) *Attorney, Agent, or Firm* — Merchant & Gould P.C.

(57) ABSTRACT

An electrostatic chuck device that adsorbs a plate-like specimen with an electrostatic adsorption electrode and cools the plate-like specimen, including an electrostatic chuck portion, a forming material of which is a ceramic sintered body, and that has one main surface that is a placement surface on which the plate-like specimen is placed, in which a plurality of protrusions supporting the plate-like specimen are provided on the placement surface, the protrusion has a top surface that is in contact with the plate-like specimen and supports the plate-like specimen, and has a cross-sectional area that gradually increases vertically downward from a height position of the top surface, and a cross-sectional area at a distance 0.6 μm vertically downward from a lower end of the top surface of the protrusion is 110% or less of a cross-sectional area of a lower end of the top surface.

7 Claims, 5 Drawing Sheets

(56) References Cited

FOREIGN PATENT DOCUMENTS

| JP | 2005-191561 A | 7/2005 |
|----|---------------|--------|
| JP | 2007-207842 A | 8/2007 |
| JP | 2008-112751 A | 5/2008 |
| JP | 2010-016176 A | 1/2010 |
| JP | 2014-027207 A | 2/2014 |

OTHER PUBLICATIONS

Office Action for Japanese Patent Application No. 2017-126619 (dated Jun. 19, 2018).

* cited by examiner

US 10,068,790 B2

ELECTROSTATIC CHUCK DEVICE

The present application is a National Stage Application under 35 U.S.C. § 371 of International Application No. PCT/JP2015/075612 filed Sep. 9, 2015, which claims the benefit of priority to Japanese Patent Application No. 2014-201304, filed Sep. 30, 2014 the disclosures of all of which are hereby incorporated by reference in their entireties. The International Application was published in Japanese on Apr. 7, 2016 as WO 2016/052115.

TECHNICAL FIELD

The present invention relates to an electrostatic chuck device.

BACKGROUND ART

Recently, in semiconductor-manufacturing processes, in response to enhancement of the integration or performance of elements, there has been a demand for additional improvements in fine processing techniques. Among these semiconductor-manufacturing processes, etching techniques are one type of important fine processing techniques. Recently, among etching techniques, plasma etching techniques capable of highly efficient fine processes of large areas have been mainstreamed.

In semiconductor-manufacturing devices in which plasma is used such as plasma etching devices, in the related art, electrostatic chuck devices in which wafers are easily mounted and fixed on a specimen table and are maintained at a desired temperature have been used.

Electrostatic chuck devices in which a plurality of protrusions are provided on a placement surface on which a plate-like specimen is placed are known (Patent Literature Nos. 1 to 4). These electrostatic chuck devices have a structure in which cooling gas is introduced toward a lower surface side of the plate-like specimen supported by the protrusions. The plate-like specimen is electrostatically adsorbed to the placement surface of the electrostatic chuck devices and is maintained at a constant temperature due to the flux of the cooling gas.

CITATION LIST

Patent Literature

[Patent Literature No. 1] Japanese Laid-open Patent Publication No. 2005-191561
[Patent Literature No. 2] Japanese Laid-open Patent Publication No. 2003-86664
[Patent Literature No. 3] Japanese Laid-open Patent Publication No. 2002-329776
[Patent Literature No. 4] Japanese Laid-open Patent Publication No. 2014-27207

SUMMARY OF INVENTION

Technical Problem

In electrostatic chuck devices, since plate-like specimens are repeatedly adsorbed and released, protrusions that are in contact with the plate-like specimens and support the plate-like specimens are abraded. Since protrusions in the related art are inclined toward the apex, the contact area with plate-like specimens increases due to abrasion, and the contact area between the protrusions and plate-like specimens increases. Therefore, electrostatic chuck devices of the related art have a problem in that thermal conduction between protrusions and plate-like specimens gradually changes in response to abrasion and thus it becomes impossible to control plate-like specimens to a predetermined temperature at the same gas pressure.

The present invention has been made in consideration of the above-described circumstances, and an object of the present invention is to provide an electrostatic chuck device capable of preventing an increase in the contact area between protrusions and plate-like specimens, which is attributed to abrasion of the protrusions, and capable of further decreasing the temporal change in thermal conduction characteristics.

Solution to Problem

The present invention is as described below.
(1) An electrostatic chuck device that adsorbs a plate-like specimen with an electrostatic adsorption electrode and cools the plate-like specimen, including: an electrostatic chuck portion, a forming material of which is a ceramic sintered body, and that has one main surface that is a placement surface on which the plate-like specimen is placed, in which a plurality of protrusions supporting the plate-like specimen are provided on the placement surface, the protrusion has a top surface that is in contact with the plate-like specimen and supports the plate-like specimen, and has a cross-sectional area that gradually increases vertically downward from a height position of the top surface, and a cross-sectional area at a distance 0.6 µm vertically downward from a lower end of the top surface of the protrusion is 110% or less of a cross-sectional area of a lower end of the top surface.
(2) The electrostatic chuck device according to (1), in which a cross-sectional area at a distance 2.6 µm vertically downward from a lower end of the top surface of the protrusion is 120% or less of a cross-sectional area of a lower end of the top surface.
(3) The electrostatic chuck device according to (1) or (2), in which the protrusion has a height that is 6 µm or more and 50 µm or less, and a cross-sectional area at a height of ½ of the protrusion is 140% or less of a cross-sectional area of a lower end of the top surface.
(4) The electrostatic chuck device according to (1), in which the top surface of the protrusion is a region that is located from an apex of the protrusion to a distance 0.4 µm vertically downward therefrom.
(5) The electrostatic chuck device according to any one of (1) to (4), in which the placement surface includes an aluminum oxide-silicon carbide composite sintered body, an aluminum oxide sintered body, an aluminum nitride sintered body, or an yttrium oxide sintered body.
(6) The electrostatic chuck device according to any one of (1) to (5), in which the top surface of the protrusion has a surface roughness Ra that is 0.1 µm or less, and a surface roughness Ra of a bottom on which the protrusion is not formed on the placement surface is 1.0 µm or less.
(7) The electrostatic chuck device according to any one of (1) to (6), in which a ratio of the sum of cross-sectional areas in lower ends of a plurality of the top surfaces with respect to an area of the placement surface in a plan view is 0.1% or more and 20% or less.

Advantageous Effects of Invention

According to the electrostatic chuck device of the present invention, it is possible to decrease the temporal change in thermal conduction characteristics by preventing an increase in the contact area between protrusions and plate-like specimens, which is attributed to abrasion of the protrusions, and stably control the temperature of plate-like specimens.

DESCRIPTION OF EMBODIMENTS

Figure 1:
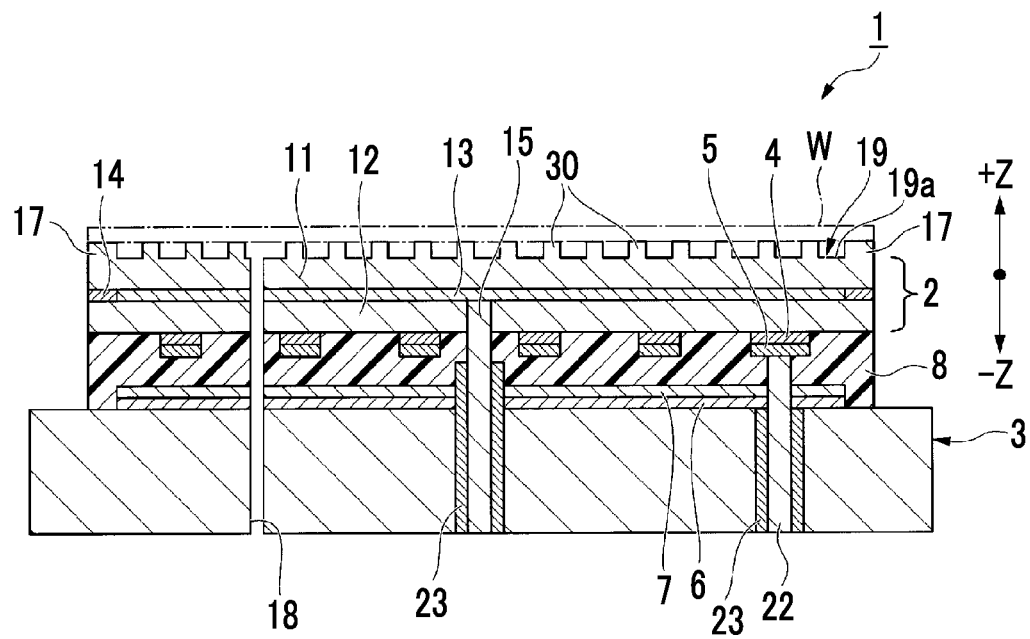
FIG. 1 is a cross-sectional view of an electrostatic chuck device of an embodiment.

Hereinafter, a preferred example of the present invention will be described, but the present invention is not limited thereto. Addition, omission, substitution, and other modification of the constitution are allowed within the scope of the gist of the present invention.

An electrostatic chuck device of the present invention is an electrostatic chuck device that adsorbs a plate-like specimen with an electrostatic adsorption electrode and cools the plate-like specimen, including an electrostatic chuck portion, a forming material of which is a ceramic sintered body, and that has one main surface that is a placement surface on which the plate-like specimen is placed, in which a plurality of protrusions supporting the plate-like specimen are provided on the placement surface, the protrusion has a top surface that is in contact with the plate-like specimen and supports the plate-like specimen, and has a cross-sectional area that gradually increases vertically downward from a height position of the top surface, and a cross-sectional area at a distance 0.6 μm vertically downward from a lower end of the top surface of the protrusion is 110% or less of a cross-sectional area of a lower end of the top surface.

According to this constitution, the cross-sectional area at a height position 0.6 μm vertically downward from the top surface is 110% or less of the cross-sectional area of the lower end of the top surface of the protrusion. Therefore, even in a case in which the protrusion is abraded approximately 0.6 μm from the top, it is possible to prevent an increase in the contact area (that is, the area of the top surface) between the protrusion and the plate-like specimen. Therefore, even in a case in which the protrusion has been abraded, the contact area between the protrusion and the plate-like specimen does not significantly increase, and a change in thermal conduction characteristics can be prevented.

In addition, in the electrostatic chuck device, the cross-sectional area at a distance 2.6 μm vertically downward from the lower end of the top surface of the protrusion may be 120% or less of the cross-sectional area of the lower end of the top surface.

According to this constitution, the cross-sectional area at a height position 2.6 μm vertically downward from the top surface reaches 120% or less of the cross-sectional area of the lower end of the top surface of the protrusion. Generally, in a case in which the protrusion is abraded and the height decreases by approximately 1 μm to 3 μm, a change in the state of the cooling effect of cooling gas is concerned, and the electrostatic chuck portion or the electrostatic chuck device is exchanged with another portion or device. Therefore, when the cross-sectional area at a height position 2.6 μm vertically downward from the top surface is set to 120% or less, it is possible to sufficiently prevent an increase in the contact area until the electrostatic chuck portion or device is exchanged.

In addition, in the electrostatic chuck device, the protrusion may have a height that is 6 μm or more and 50 μm or less, and the cross-sectional area at a height of ½ of the protrusion may be 140% or less of the cross-sectional area of the lower end of the top surface.

According to this constitution, the cross-sectional area at a position of ½ of the height of the protrusion reaches 140% or less of the cross-sectional area of the lower end of the top surface of the protrusion. Therefore, even in a case in which half of the height of the protrusion is abraded, it is possible to prevent an increase in the contact area (that is, the area of the top surface) between the protrusion and the plate-like specimen. Therefore, even in a case in which the protrusion has been abraded, a change in thermal conduction characteristics between the protrusion and the plate-like specimen can be prevented.

In addition, in the electrostatic chuck device, the top surface of the protrusion may be a region that is located from the apex of the protrusion to a distance 0.4 μm vertically downward therefrom.

The top surface is a region that comes into contact with the plate-like specimen at the front end of the protrusion. The top surface of the protrusion is formed of a gently curved surface, and the plate-like specimen is deformed along the top surface and is supported.

Since the degree of deformation of the plate-like specimen relies on the adsorption force of the electrostatic chuck device, the introduction pressure of cooling gas, or the like, the contact area between the protrusion and the plate-like specimen also changes accordingly. The top surface can be set to a region from the apex to a distance 0.4 μm vertically downward therefrom by adjusting the absorption force of the electrostatic chuck device and the introduction pressure of cooling gas, and, when the top surface is set as described above, it is possible to set the contact area between the plate-like specimen and the protrusion to an appropriate size.

In addition, in the electrostatic chuck device, the top surface of the protrusion may have a surface roughness Ra that is 0.03 μm or less, and the surface roughness Ra of the bottom on which the protrusion is not formed on the placement surface may be 1.0 μm or less.

According to this constitution, since the top surface of the protrusion has a surface roughness Ra that is 0.03 μm or less, the contact between the protrusion and the plat-like specimen becomes smooth. Friction between the plate-like specimen and the protrusion becomes small, and the protrusions are not easily abraded when the plate-like specimen is adsorbed to or released from the electrostatic chuck device. Therefore, not only does the height of the protrusion easily become low, but the generation of particles can also be prevented.

Additionally, according to this constitution, since the surface roughness Ra of the bottom on which the protrusion is not formed on the placement surface is 1.0 μm or less, it is possible to prevent the generation of particles even in a case in which the plate-like specimen comes into contact with the bottom due to the partial deformation or the like of the plate-like specimen.

In addition, in the electrostatic chuck device, the ratio of the sum of cross-sectional areas in the lower ends of a plurality of the top surfaces with respect to the area of the placement surface in a plan view may be set to 0.1% or more and 20% or less.

According to this constitution, the ratio of the cross-sectional areas in the lower ends of the top surfaces of the protrusions with respect to the entire placement surface is set to 20% or less. The temperature of the plate-like specimen is controlled using thermal conduction with the protrusions and thermal conduction with cooling gas. When the ratio of the cross-sectional areas in the lower ends of the top surfaces of the protrusions is set to 20% or less, it is possible to decrease the influence of thermal conduction between the plate-like specimen and the protrusions and relatively increase the influence of thermal conduction of cooling gas. Therefore, it is possible to decrease the influence of a change in the contact area between the abraded protrusions and the plate-like specimen.

In addition, according to this constitution, the ratio of the cross-sectional areas in the lower ends of the top surfaces of the protrusions with respect to the entire placement surface is set to 0.1% or more. Therefore, it is possible to ensure a sufficient contact area without excessively deforming the plate-like specimen and support the plate-like specimen with the protrusions.

Hereinafter, an electrostatic chuck device 1 which is an embodiment of the present invention will be described on the basis of the accompanying drawings.

In some of the drawings used in the following description, for convenience, characteristics parts are illustrated in an enlarged manner for the purpose of emphasizing the characteristics parts, and the dimensional ratios and the like of individual constituent elements are not always identical to those of actual elements. In addition, for the same purpose, there are cases in which non-characteristic parts are not illustrated.

<Electrostatic Chuck Device>

Figure 2:
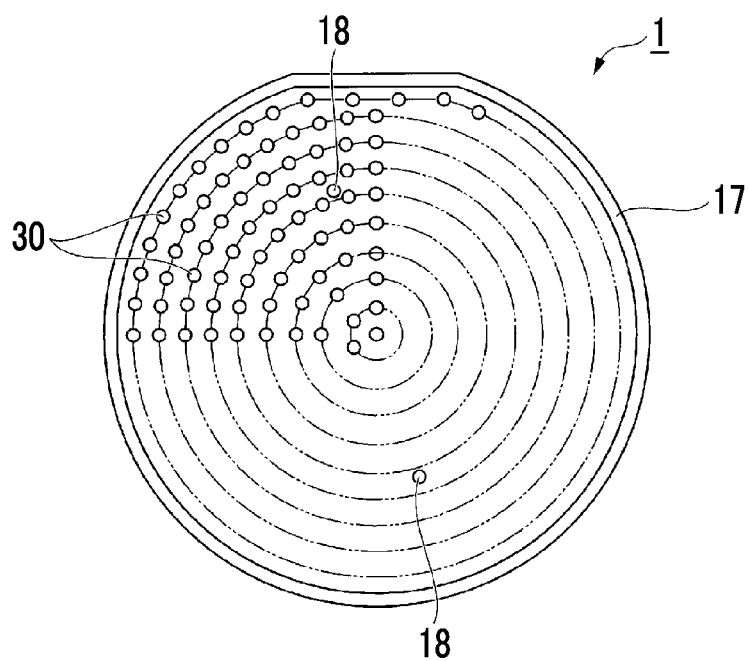
FIG. 2 is a plan view of the electrostatic chuck device of the embodiment.

FIG. 1 is a cross-sectional view of the electrostatic chuck device 1, and FIG. 2 is a plan view of the electrostatic chuck device 1.

As illustrated in FIG. 1, the electrostatic chuck device 1 has a disc-like electrostatic chuck portion 2, a thick disc-like cooling base portion 3 that adjusts the electrostatic chuck portion 2 to a desired temperature, an adhesive material 4 that is adhered to a lower surface (the other main surface) of the electrostatic chuck portion 2 and has a predetermined pattern, a heater element 5 that is adhered to the lower surface of the adhesive material 4 and has a pattern of the same shape as that of the adhesive material 4, an insulating material 7 adhered to the upper surface of the cooling base portion 3 through an adhesive material 6, and a resin layer 8 made of an organic adhesive or the like that adheres and integrates the heater element 5 on the lower surface of the electrostatic chuck portion 2 and the insulating material 7 on the cooling base portion 3 in a state in which the heater element and the insulating member face each other.

The electrostatic chuck device 1 has a structure in which the cooling base portion 3, the resin layer 8, and the electrostatic chuck portion 2 are laminated in this order in a +Z direction (height direction) in FIG. 1.

In the electrostatic chuck device 1, a cooling gas introduction hole 18 that penetrates the electrostatic chuck portion 2, the resin layer 8, the insulating member 7, the adhesive material 6, and the cooling base portion 3 is formed. Cooling gas such as He is supplied from the cooling gas introduction hole 18. The cooling gas flows through gaps between a placement surface 19 of the electrostatic chuck portion 2 and the lower surface of a plate-like specimen Wand decreases the temperature of the plate-like specimen W.

The electrostatic chuck portion 2 has a placement plate 11 having an upper surface (one main surface) that serves as the placement surface 19 on which the plate-like specimen W such as a semiconductor wafer is placed, a supporting plate 12 that is integrated with the placement plate 11 and supports the placement plate 11, an electrostatic adsorption internal electrode 13 provided between the placement plate 11 and the supporting plate 12, an insulating material layer 14 that insulates the circumference of the electrostatic adsorption internal electrode 13, and a power feeding terminal 15 that is provided so as to penetrate the supporting plate 12 and applies a direct-current voltage to the electrostatic adsorption internal electrode 13.

As illustrated in FIGS. 1 and 2, on the placement surface 19 of the electrostatic chuck portion 2, a plurality of protrusions 30 having a diameter that is smaller than the thickness of the plate-like specimen W are formed. The electrostatic chuck device 1 is constituted so that the plurality of protrusions 30 support the plate-like specimen W. The shape of the protrusion 30 will be described in detail below.

In addition, a peripheral edge wall 17 is formed at the peripheral edge of the placement surface 19. The peripheral edge wall 17 is formed at the same height as that of the protrusion 30 and supports the plate-like specimen W together with the protrusions 30. The peripheral edge wall 17 is provided in order to prevent the leakage of the cooling gas that is introduced between the placement surface 19 and the plate-like specimen W.

The placement plate 11 and the supporting plate 12 are disc-like members having the same shape in the surfaces that overlap each other and is made of an insulating ceramic sintered body having a mechanical strength and durability with respect to corrosive gas and plasma thereof such as an aluminum oxide-silicon carbide ($Al_2O_3$—SiC) composite sintered body, an aluminum oxide ($Al_2O_3$) sintered body, an aluminum nitride (AlN) sintered body, or an yttrium oxide ($Y_2O_3$) sintered body.

The average particle diameter of ceramic particles in the ceramic sintered body is preferably 10 μm or less and more preferably 2 μm or less. Sand blast processing is carried out in a process of forming the protrusions 30 provided on the placement surface 19 of the electrostatic chuck portion 2. Since the sand blast step is a step in which the surface of the placement surface 19 is damaged and excavated, cracks remain in the protrusions 30. The cracks are forcibly propagated by buffing that is carried out after the sand blast step and is removed in advance.

The cracks are formed in grain boundaries between ceramic particles in the ceramic sintered body. Therefore, in a case in which the particle diameter of ceramic particles is large, large corner portions are removed along grain boundaries by buffing. As the particle diameters of ceramic particles increase, the shape of the protrusion 30 becomes rounder. As described below, since the protrusion 30 of the present embodiment preferably has a cross-sectional area that does not change in the height direction, the protrusion 30 is preferably not round. When the average particle diameter of ceramic particles is set to 10 μm or less (more preferably 2 μm or less), it is possible to form the protrusions 30 having a cross-sectional area that does not change in the height direction on the placement surface 19.

The total thickness of the placement plate 11, the supporting plate 12, the electrostatic adsorption internal electrode 13, and the insulating material layer 14, that is, the thickness of the electrostatic chuck portion 2 is preferably 0.5 mm or more and 5.0 mm or less. When the thickness of the electrostatic chuck portion 2 is less than 0.5 mm, it is not possible to ensure the mechanical strength of the electrostatic chuck portion 2. On the other hand, when the thickness of the electrostatic chuck portion 2 is more than 5.0 mm, the heat capacity of the electrostatic chuck portion 2 becomes excessively great and thus the thermal responsiveness of the plate-like specimen W being placed deteriorates, and furthermore, it becomes difficult to maintain the in-plane temperature of the plate-like specimen W in a desired temperature pattern due to an increase in the thermal conduction of the electrostatic chuck portion 2 in the horizontal direction.

Particularly, the thickness of the placement plate 11 is preferably 0.3 mm or more and 2.0 mm or less. When the thickness of the placement plate 11 is less than 0.3 mm, there is a high risk of discharging due to the voltage applied to the electrostatic adsorption internal electrode 13. On the other hand, when the thickness of the placement plate is more than 2.0 mm, it is not possible to sufficiently adsorb and fix the plate-like specimen W, and thus it becomes difficult to sufficiently heat the plate-like specimen W.

The electrostatic adsorption internal electrode 13 is a member that is used as an electrostatic chucking electrode for fixing the plate-like specimen W with an electrostatic adsorption force by generating charges, and the shape and size thereof are appropriately adjusted depending on applications.

The electrostatic adsorption internal electrode 13 is formed of conductive ceramic such as an aluminum oxide-tantalum carbide ($Al_2O_3$—$Ta_4C_5$) conductive composite sintered body, an aluminum oxide-tungsten ($Al_2O_3$—W) conductive composite sintered body, an aluminum oxide-silicon carbide ($Al_2O_3$—SiC) conductive composite sintered body, an aluminum nitride-tungsten (AlN—W) conductive composite sintered body, an aluminum nitride-tantalum (AlN—Ta) conductive composite sintered body, or a yttrium oxide-molybdenum ($Y_2O_3$—Mo) conductive composite sintered body or high-melting point metal such as tungsten (W), tantalum (Ta), or molybdenum (Mo).

The thickness of the electrostatic adsorption internal electrode 13 is not particularly limited, but is preferably 0.1 μm or more and 100 μm or less, and particularly preferably 5 μm or more and 20 μm or less.

When the thickness is less than 0.1 μm, it is not possible to ensure sufficient electrical conductivity. On the other hand, when the thickness exceeds 100 μm, cracks are easily generated in joint interfaces between the electrostatic adsorption internal electrode 13, the placement plate 11, and the supporting plate 12 due to the difference in the coefficient of thermal expansion between the electrostatic adsorption internal electrode 13, the placement plate 11, and the supporting plate 12.

The electrostatic adsorption internal electrode 13 having the above-described thickness can be easily formed using a film formation method such as a sputtering method or a deposition method or a coating method such as a screen printing method.

The insulating material layer 14 surrounds the electrostatic adsorption internal electrode 13 and protects the electrostatic adsorption internal electrode 13 from corrosive gas and plasma thereof. In addition, the insulating material layer 14 joins and integrates the boundary portion between the placement plate 11 and the supporting plate 12, that is, outer circumferential portion regions other than the electrostatic adsorption internal electrode 13. The insulating material layer 14 is constituted of an insulating material having the same composition or main component as that of the material constituting the placement plate 11 and the supporting plate 12.

The power feeding terminal 15 is a rod-like member provided in order to apply a direct-current voltage to the electrostatic adsorption internal electrode 13, and the material for the power feeding terminal 15 is not particularly limited as long as the material is a conductive material having excellent heat resistance. The power feeding terminal 15 preferably has a coefficient of thermal expansion that is similar to the coefficients of thermal expansion of the electrostatic adsorption internal electrode 13 and the supporting plate 12, and, for example, the conductive ceramic constituting the electrostatic adsorption internal electrode 13 or a metallic material such as tungsten (W), tantalum (Ta), molybdenum (Mo), niobium (Nb), or a cobalt alloy is preferably used.

The power feeding terminal 15 is insulated from the cooling base portion 3 using an insulator 23 having an insulating property.

The power feeding terminal 15 is joined and integrated with the supporting plate 12, and furthermore, the placement plate 11 and the supporting plate 12 are joined and integrated using the electrostatic adsorption internal electrode 13 and the insulating material layer 14, thereby constituting the electrostatic chuck portion 2.

The cooling base portion 3 adjusts the electrostatic chuck portion 2 to a desired temperature and has a thick disc shape.

The cooling base portion 3 is preferably, for example, a water cooling base or the like in which a flow channel (not illustrated) for circulating water is formed.

The material constituting the cooling base portion 3 is not particularly limited as long as the material is a metal having excellent thermal conductivity, electrical conductivity, and workability or a compound material containing the above-described metal, and, for example, aluminum (Al), an aluminum alloy, copper (Cu), a copper alloy, stainless steel (SUS), or the like is preferably used. It is preferable to carry out an almite treatment or form an insulating film such as alumina on at least the surface of the cooling base portion 3 that is exposed to plasma.

The adhesive material layer 4 is a sheet-like or film-like adhesive resin that has heat resistance and an insulating property and has the same pattern shape as that of the heater element 5 described below such as a polyimide resin, a silicone resin, or an epoxy resin, and the thickness thereof is preferably 5 μm to 100 μm and more preferably 10 μm to 50 μm.

The variation in the in-plane thickness of the adhesive material 4 is preferably 10 μm or less. When the variation in the in-plane thickness of the adhesive material 4 exceeds 10 μm, variation of more than 10 μm is caused in the in-plane interval between the electrostatic chuck portion 2 and the heater element 5. As a result, the in-plane uniformity of heat transferred to the electrostatic chuck portion 2 from the heater element 5 degrades, and the in-plane temperature on the placement surface 19 of the electrostatic chuck portion 2 becomes uneven, which is not preferable.

The heater element 5 is adsorbed and fixed to the lower surface of the supporting plate 12 with the adhesive material 4. The heater element 5 is one continuous belt-like heater pattern of a meandering belt-like metallic material having a narrow width. The power feeding terminal 22 illustrated in FIG. 1 is connected to both end portions of the belt-like heater element 5, and the power feeding terminal 22 is insulated from the cooling base portion 3 using the insulator 23 having an insulating property.

The heater pattern of the heater element 5 may be constituted of one heater pattern or may be constituted of two or more mutually independent heater patterns. The temperature of the plate-like specimen W during treatments can be freely controlled by individually controlling a plurality of mutually independent heater patterns.

The heater element 5 is formed by etching a non-magnetic metal thin plate having a constant thickness that is 0.2 mm or less and preferably 0.1 mm or less, for example, a titanium (Ti) thin plate, a tungsten (W) thin plate, or a molybdenum (Mo) thin plate into a desired heater pattern using a photolithography method.

The reason for setting the thickness of the heater element 5 to 0.2 mm or less is that, when the thickness exceeds 0.2 mm, the pattern shape of the heater element 5 is reflected in the temperature distribution of the plate-like specimen W, and it becomes difficult to maintain the in-plane temperature of the plate-like specimen W in a desired temperature pattern.

In addition, when the heater element 5 is formed of a non-magnetic metal, the heater element 5 does not self-generate heat due to high frequencies even when the electrostatic chuck device 1 is used in a high-frequency atmosphere, and thus it becomes easy to maintain the in-plane temperature of the plate-like specimen W in a desired constant temperature or constant temperature pattern.

In addition, when the heater element 5 is formed using a non-magnetic metal thin plate having a constant thickness, the thickness of the heater element 5 becomes constant in the entire region of the heated surface. Therefore, it is possible to set the amount of heat generated from the heater element 5 to be constant in the entire region of the heated surface, and it is possible to uniform the temperature distribution on the placement surface 19 of the electrostatic chuck portion 2.

The adhesive material 6 adheres the insulating material 7 to the upper surface of the cooling base portion 3, is, similar to the adhesive material 4, a sheet-like or film-like adhesive resin that has heat resistance and an insulating property such as a polyimide resin, a silicone resin, or an epoxy resin, and the thickness thereof is preferably 5 μm to 100 μm and more preferably 10 μm to 50 μm.

The variation in the in-plane thickness of the adhesive material 6 is preferably 10 μm or less. When the variation in the in-plane thickness of the adhesive material 6 exceeds 10 μm, variation of more than 10 μm is caused in the in-plane interval between the cooling base portion 3 and the insulating member 7. As a result, the in-plane uniformity of the temperature control of the electrostatic chuck portion 2 using the cooling base portion 3 degrades, and the in-plane temperature on the placement surface 19 of the electrostatic chuck portion 2 becomes uneven, which is not preferable.

The insulating material 7 is a film-like or sheet-like resin having an insulating property and voltage resistance such as a polyimide resin, a silicone resin, or an epoxy resin, and the variation in the in-plane thickness of the insulating member 7 is preferably 10 μm or less.

When the variation in the in-plane thickness of the insulating material 7 exceeds 10 μm, a difference is caused in the height of the temperature distribution depending on the thickness. As a result, the temperature control by adjusting the thickness of the insulating material 7 is adversely affected, which is not preferable.

The thermal conductivity of the insulating material 7 is preferably 0.05 W/mk or more and 0.5 W/mk or less and more preferably 0.1 W/mk or more and 0.25 W/mk or less.

When the thermal conductivity is less than 0.1 W/mk, thermal conduction from the electrostatic chuck portion 2 to the cooling base portion 3 through the insulating material 7 does not easily occur, and the cooling rate decreases, which is not preferable. On the other hand, when the thermal conductivity exceeds 1 W/mk, thermal conduction from a heater element 5 to the cooling base portion 3 through the insulating material 7 increases, and the temperature-increase rate decreases, which is not preferable.

The resin layer 8 is interposed between the lower surface of the electrostatic chuck portion 2 and the upper surface of the cooling base portion 3. The resin layer 8 adheres and integrates the electrostatic chuck portion 2 to which the heater element 5 is adhered and the cooling base portion 3 and has a thermal stress-relaxation action.

The number of voids or defects in the resin layer 8 or in the interfaces between the resin layer and the lower surface of the electrostatic chuck portion 2, the lower surface of the heater element 5, and the upper surface of the cooling base portion 3 is desirably small. When voids or defects are formed, thermal conductivity degrades, and thus there is a concern that the temperature uniformity of the plate-like specimen W may be impaired.

The resin layer 8 is formed of, for example, a cured body obtained by heating and curing a silicone-based resin composition or an acrylic resin. The resin layer 8 is preferably formed by loading a fluidic resin composition between the electrostatic chuck portion 2 and the cooling base portion 3 and then heating and curing the resin composition. The heater element 5 is provided on the lower surface of the electrostatic chuck portion 2 and thus forms unevenness on the surface.

In addition, the upper surface of the cooling base portion 3 and the lower surface of the electrostatic chuck portion 2 are not necessarily flat. When the resin layer 8 is formed by loading a fluidic resin composition between the cooling base portion 3 and the electrostatic chuck portion 2 and then curing the resin composition, it is possible to prevent the generation of voids in the resin layer 8 using the unevenness between the electrostatic chuck portion 2 and the cooling base portion 3. Therefore, it is possible to uniform the thermal conduction characteristics of the resin layer 8 in the plane, and it is possible to enhance the temperature uniformity of the electrostatic chuck portion 2.

<Protrusions>

Figure 3A:
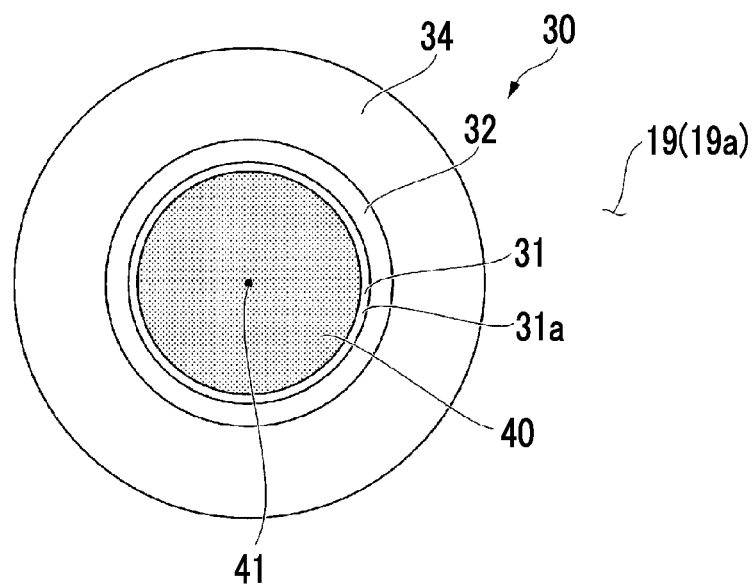
FIG. 3A illustrates a plan view of a protrusion 30 provided in the electrostatic chuck device of the embodiment.
Figure 3B:
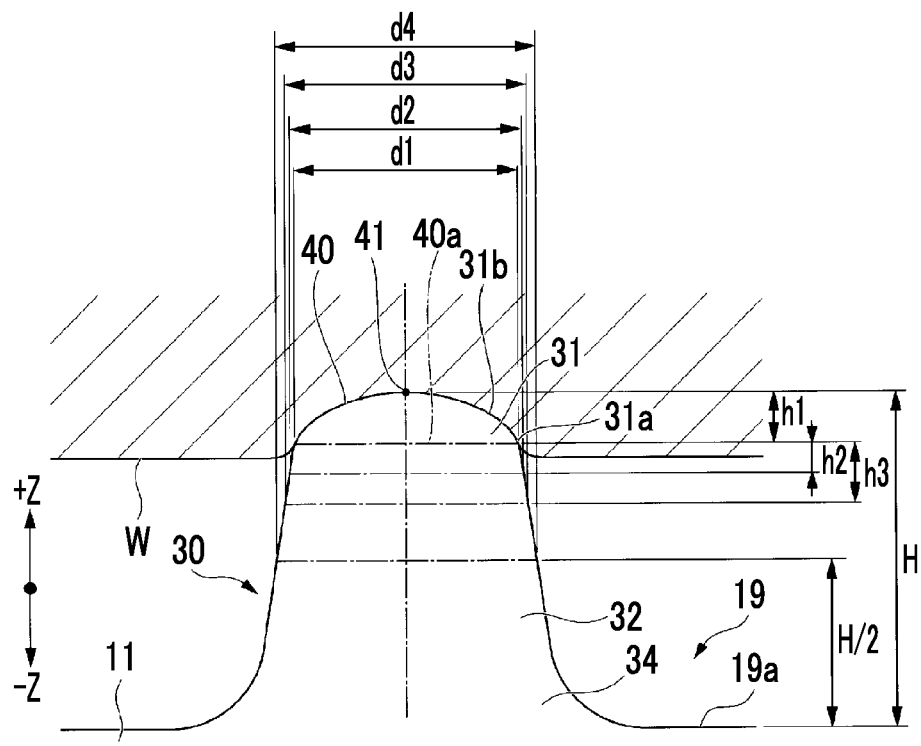
FIG. 3B is a side view of the protrusion 30 which supports a plate-like specimen and is provided in the electrostatic chuck device of the embodiment.

FIG. 3A is a plan view of the protrusion 30 and FIG. 3B is a side view of the protrusion 30 supporting the plate-like specimen W. FIGS. 3A and 3B are illustrated in a dimensional ratio different from that of the actual shape for the purpose of emphasizing characteristic portions.

A plurality of the protrusions 30 are provided on the placement surface 19 that is the upper surface of the placement plate 11 and are formed so as to protrude upward from a bottom 19a of the placement surface 19. The protrusion 30 has a substantially truncated cone shape and has a cross-section along the bottom 19a which is a round shape. The shape of the protrusion 30 is not limited to the truncated cone shape. In addition, the cross-sectional shape of the protrusion 30 is not limited to the round shape and may be a rectangular shape or a triangular shape.

The protrusion 30 has a height H (that is, the distance from the bottom 19a to the apex 41) that is preferably formed to be 6 µm or more and 50 µm or less and more preferably formed to be 6 µm or more and 20 µm or less.

The protrusion 30 has a front end portion 31 located at the front end, a column portion 32 having a cross-sectional diameter that decreases toward the front end side at a substantially constant slope, and a foot portion 34 that connects the column portion 32 and the bottom 19a at a smooth curvature.

The front end portion 31 rises as a smoothly curved surface, and the apex 41 is located at the tip of the front end portion 31. The surface of the front end portion 31 includes a corner surface 31a that is smoothly connected to the column portion 32 at the peripheral edge of the front end portion 31, and a smooth curved surface 31b located inside the corner surface 31a.

The radius of curvature of the corner surface 31a is preferably less than 1 µm and more preferably 0.5 µm or less. In addition, the radius of curvature of the smooth curved surface 31b is preferably great, and the smooth curved surface is most preferably a flat surface that does not form a curved surface.

The front end portion 31 comes into contact with the plate-like specimen W. In the front end portion 31, the plate-like specimen W deforms along the smoothly curved surface. In the front end portion 31, the region in which the plate-like specimen W and the protrusion 30 come into contact with each other is considered as the top surface 40.

The top surface 40 is a certain region that is located from the apex 41 to a distance h1 vertically downward therefrom in the protrusion 30.

The size of the top surface 40 changes depending on the degree of deformation of the plate-like specimen W. The degree of deformation of the plate-like specimen W changes depending on the balance between the adsorption force of the electrostatic chuck device 1 and the pressure of cooling gas flowing between the lower surface of the plate-like specimen W and the bottom 19a. Ina case in which the adsorption force of the electrostatic chuck device 1 is great or the cooling gas pressure is high, the plate-like specimen W sinks more. Therefore, the size of the top surface 40 relies on the adsorption force of the electrostatic chuck device 1 and the introduction pressure of cooling gas.

As an example, the top surface 40 is a region that is located from the apex 41 of the protrusion 30 to a distance h1 that is set to 0.4 µm vertically downward therefrom.

The top surface 40 is formed only on the smooth curved surface 31b of the front end portion 31 or is formed so as to cover the entire smooth curved surface 31b and part of the corner surface 31a depending on the adsorption force or the gas pressure.

The surface roughness Ra of the top surface 40 is preferably set to 0 µm or more and 0.1 µm or less, more preferably set to 0 µm or more and 0.05 µm or less, still more preferably set to 0 µm or more and 0.03 µm or less, and far still more preferably set to 0 µm or more and 0.015 µm or less. When the surface roughness Ra of the top surface 40 is set to 0 µm or more and 0.1 µm or less (more preferably set to 0 µm or more and 0.05 µm or less, still more preferably set to 0 µm or more and 0.03 µm or less, and far still more preferably set to 0 µm or more and 0.015 µm or less), it is possible to prevent friction between the protrusion 30 and the plate-like specimen W. Therefore, the plate-like specimen W being damaged due to the contact with the plate-like specimen W is prevented. In addition, when the plate-like specimen W is adsorbed to or released from the electrostatic chuck device, the protrusions 30 are not easily abraded, and the generation of particles attributed to abrasion can be prevented.

The surface roughness Ra refers to a value expressed using micrometer (µm) which is obtained from the following expression when the standard length 1 of roughness curves are taken out in a direction of the average line thereof, the direction of the average line of the taken-out parts is considered as the x axis, the vertical direction is considered as the y axis, and the roughness curves are expressed as y=f(x).

$$Ra = \frac{1}{l}\int_0^l |f(x)|dx \qquad \text{[Expression 1]}$$

In a case in which the area of the top surface 40 is small, there are cases in which it is not possible to sufficiently ensure the measurement length for measuring the surface roughness Ra. In this case, the surface roughness Ra of the top surface 40 can be estimated by measuring that of a separate portion formed under the same condition as the protrusion 30. Specifically, the surface roughness Ra of the top surface 40 can be estimated by measuring that of the upper surface of the peripheral edge wall 17 provided at the peripheral edge of the placement surface 19 (refer to FIGS. 1 and 2).

The protrusion 30 of the present embodiment has a cross-sectional shape that is a round shape at a lower end 40a (that is, the boundary of the contact region between the protrusion 30 and the plate-like specimen W) of the top surface 40. The diameter d1 of the cross-section of the top surface 40 at the lower end 40a is preferably 100 µm or more and 3,000 µm or less and more preferably 200 µm or more and 2,000 µm or less. The cross-sectional area of the top surface 40 at the lower end 40a is expressed as $\pi \times (d1/2)^2$ using the diameter d1. Therefore, the cross-sectional area of the top surface 40 at the lower end 40a is preferably $7.9 \times 10^{-3}$ mm$^2$ or more and 7.1 mm$^2$ or less and more preferably $3.1 \times 10^{-2}$ mm$^2$ or more and 3.1 mm$^2$ or less.

The column portion 32 is formed so that the cross-sectional area gradually decreases toward the front end portion 31 from the bottom 19a side. The change ratio of the cross-sectional area of the column portion 32, that is, the slope of the circumferential surface of the column portion 32 may be constant in the height direction, or the change ratio (slope) may change in the height direction.

The foot portion 34 smoothly connects the bottom 19a and the column portion 32. When the size of the foot portion 34 is increased (that is, the radius of curvature of the foot portion 34 is increased in the visual field of a side view (FIG. 3B)), it is possible to increase the amount of heat moving between the protrusion 30 and the placement plate 11. Therefore, when the size of the foot portion 34 is increased, the thermal responsiveness of the protrusion 30 enhances, and it is possible to control the temperature of the plate-like specimen W at a high rate. In addition, when the size of the foot portion 34 is increased, particles generated due to the abrasion or the like of the protrusion 30 do not easily remain between the bottom 19a and the column portion 32, and thus it is possible to enhance the property of removing particles.

The bottom 19a of the placement surface 19 is located in a region in which the protrusions 30 are not provided. The surface roughness Ra of the bottom 19a is preferably set to 0 µm or more and 1.0 µm or less and more preferably set to 0 µm or more and 0.8 µm or less. In such a case, it is possible to prevent the generation of particles due to the partial deformation or the like of the plate-like specimen W even in a case in which the plate-like specimen W comes into contact with the bottom 19a.

The protrusions 30 are abraded due to the repetition of the adsorption and release of the plate-like specimen W to and from the electrostatic chuck device 1.

Figure 4:
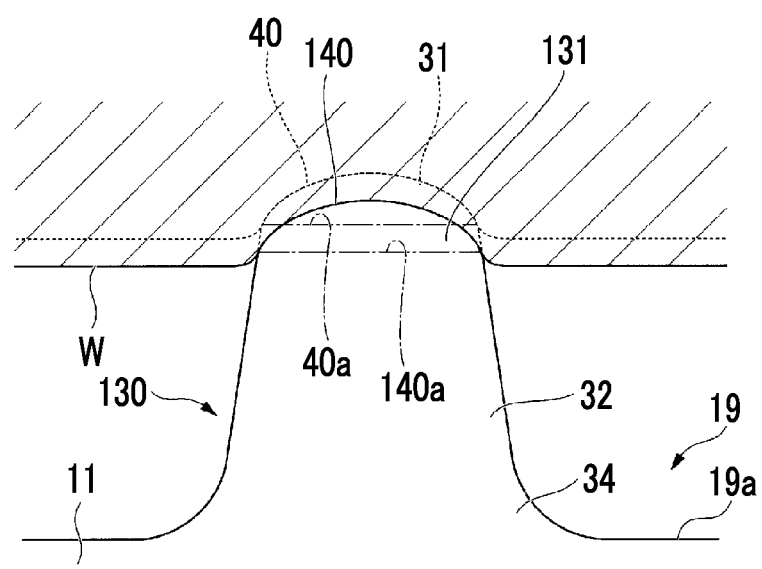
FIG. 4 is a side view illustrating the protrusion provided in the electrostatic chuck device of the embodiment in an abraded state.

FIG. 4 is a view illustrating a protrusion 130 after abrasion. In FIG. 4, the protrusion 30 before abrasion is illustrated using a broken line.

In the protrusion 130 after abrasion, a new front end portion 131 is formed due to abrasion. The shape of the front end portion 131 after abrasion is flattened due to abrasion and thus has a radius of curvature that is larger or remains almost unchanged compared with the shape of the front end portion 31 before abrasion.

The protrusion 130 after abrasion supports the plate-like specimen W at the front end portion 131. The front end portion 131 includes a new top surface 140 that is the contact region with the plate-like specimen W.

The top surface 140 of the protrusion 130 after abrasion is located vertically downward from the top surface 40 of the protrusion 30 before abrasion. Since the protrusion 30 has a truncated cone shape having a cross-sectional area that gradually increases downward, the surface area of the top surface 140 after abrasion becomes larger than that of the top surface 40 before abrasion. That is, the contact area between the protrusion 130 after abrasion and the plate-like specimen W becomes larger than that before abrasion.

In the protrusion 30, the cross-sectional area at a distance h2 of 0.6 µm from the lower end 40a of the top surface 40 in the height direction is preferably set to 100% or more and 110% or less and more preferably set to 100% or more and 105% or less of the cross-sectional area of the lower end 40a. Therefore, the protrusion 130 that has been abraded approximately 0.6 µm from the top is capable of preventing an increase in the contact area between the protrusion 30 before abrasion and the plate-like specimen W. Therefore, even after abrasion, the contact area between the protrusion 130 and the plate-like specimen W does not significantly increase, and a change in thermal conduction characteristics before and after abrasion can be prevented.

In the protrusion 30 of the present embodiment, the cross-sectional area at a position 0.6 µm vertically downward from the lower end 40a of the top surface 40 is expressed as $\pi \times (d2/2)^2$ using the diameter d2 at a position 0.6 µm vertically downward from the lower end 40a of the top surface 40.

Furthermore, in the protrusion 30, the cross-sectional area at a distance h3 of 2.6 µm from the lower end 40a of the top surface 40 in the height direction is preferably set to 100% or more and 120% or less and more preferably set to 100% or more and 110% or less of the cross-sectional area of the lower end 40a.

Generally, in a case in which the protrusion 30 is abraded and the height thereof is decreased approximately 1 µm to 3 µm, there is a concern that the state of the cooling effect of cooling gas may change, and the electrostatic chuck portion 2 or the electrostatic chuck device 1 is exchanged with another portion or device. Therefore, when the cross-sectional area at a height position 2.6 µm vertically downward from the top surface 40 is set to 100% or more and 120% or less and more preferably set to 100% or more and 110% or less, it is possible to sufficiently prevent an increase in the contact area until the electrostatic chuck portion or device is exchanged.

In the protrusion 30 of the present embodiment, the cross-sectional area at a position 2.6 µm vertically downward from the lower end 40a of the top surface 40 is expressed as $\pi \times (d3/2)^2$ using the diameter d3 at a position 2.6 µm vertically downward from the lower end 40a of the top surface 40.

Additionally, in the protrusion 30, the cross-sectional area at half (H/2) of the height H of the protrusion 30 is preferably 100% or more and 140% or less and more preferably set to 100% or more and 110% or less of the cross-sectional area of the lower end 40a of the top surface 40. Therefore, even in a case in which half of the height H of the protrusion 30 is abraded, it is possible to prevent an increase in the contact area between the protrusion 30 and the plate-like specimen W.

In the protrusion 30 of the present embodiment, the cross-sectional area at half (H/2) of the height H of the protrusion 30 is expressed as $\pi \times (d4/2)^2$ using the diameter d4 at a position of half (H/2) of the height H of the protrusion 30.

The front end portion 31 in which the top surface 40 is constituted has the smooth curved surface 31b and the corner surface 31a. The radii of curvature of the smooth curved surface 31b and the corner surface 31a are sufficiently great with respect to the diameter of the lower end 40a of the top surface 40. On the basis of the above-described fact, the surface area of the top surface 40 (that is, the contact area between the protrusion 30 and the plate-like specimen W) can be approximated to the cross-sectional area of the lower end 40a of the top surface 40. In addition, the amount of heat transferred between the protrusion 30 and the plate-like specimen W per unit time is proportional to the contact area.

Therefore, a change in the cross-sectional area of the lower end 40a or 140a of the top surface 40 or 140 before and after abrasion illustrated in FIG. 4 is proportional to a change in the amount of heat transferred between the protrusion 30 or 130 before and after abrasion and the plate-like specimen W per unit time.

The cross-sectional area of the lower end 140a of the top surface 140 in the protrusion 130 after abrasion is preferably 140% or less, more preferably 120% or less, and still more preferably 110% or less of the cross-sectional area of the lower end 40a of the top surface 40 in the protrusion 30 before abrasion.

In such a case, it is possible to respectively set the amount of heat transferred between the protrusion 130 after abrasion and the plate-like specimen W to 140% or less, 120% or less, and 110% or less of the amount of heat transferred between the protrusion 30 before abrasion and the plate-like specimen W.

When the change in the amount of heat transferred per unit time before and after abrasion is 140% or less, it is possible to prevent a change in the temperature of the plate-like specimen W by adjusting the introduction pressure of cooling gas. That is, a change in thermal conduction between the protrusion 30 and the plate-like specimen W can be compensated for and adjusted by thermal conduction between cooling gas and the plate-like specimen W. Therefore, the temperature can be controlled in the same manner as before abrasion even after the protrusions are abraded.

In addition, in a case in which the change in the amount of heat transferred per unit time before and after abrasion is 120% or less, the influence on the temperature of the plate-like specimen W is sufficiently small and can be allowed. Therefore, it is not necessary to adjust the introduction pressure of cooling gas, and it becomes possible to control the temperature in the same manner as before abrasion.

Furthermore, in a case in which the change in the amount of heat transferred per unit time before and after abrasion is 110% or less, the influence on the temperature of the plate-like specimen W can be almost ignored.

A plurality of the protrusions 30 are provided on the placement surface 19, and a plurality of the top surfaces 40 are present in accordance with the respective protrusions 30. The sum of the cross-sectional areas of the lower ends 40a of the plurality of top surfaces 40 is preferably set to 0.1% or more and 20% or less and more preferably set to 0.1% or more and 10% or less of the area of the placement surface 19 in a plan view.

The temperature of the plate-like specimen W is controlled using thermal conduction with the protrusions 30 and thermal conduction by cooling gas. When the ratio of the cross-sectional areas in the lower ends 40a of the top surfaces 40 of the protrusions 30 is set to 20% or less (more preferably set to 10% or less), the influence of thermal conduction between the plate-like specimen W and the protrusions 30 is decreased, and the influence of the thermal conduction of cooling gas can be relatively increased. Therefore, it is possible to decrease the influence of a change in the contact area between the abraded protrusions 30 and the plate-like specimen W.

In addition, in a case in which the sum of the cross-sectional areas in the lower ends 40a of the plurality of top surfaces 40 is too small, there is a concern that the plate-like specimen W that comes into contact with the protrusions 30 may excessively deform due to the insufficient contact area. When the ratio of the cross-sectional area of the lower ends 40a of the top surfaces 40 of the protrusions 30 is set to 0.1% or more, a sufficient contact area is ensured so that the plate-like specimen W is not excessively deformed, and the plate-like specimen W can be supported by the protrusions 30.

Next, a method for forming the protrusions 30 on the placement surface 19 of the placement plate 11 will be described on the basis of FIGS. 5A to 5C.

The protrusions 30 can be formed using, for example, mechanical processing such as grind stone processing or laser carving, sand blast processing, or the like. In addition, as finish polishing, it is possible to efficiently carry out buffing in which fine abrasive grains and a buffing material are used or ultrasonic polishing in which fine abrasive grains and ultrasonic waves are used.

In addition, in a step of forming the protrusions 30, the peripheral edge wall 17 (refer to FIGS. 1 and 2) can be formed at the same time by carrying out the same step on the peripheral edge of the placement surface 19.

In the present embodiment, a case in which sand blast processing is carried out and then buffing is carried out as a polishing step will be described.

First, the placement surface 19 that is the upper surface of the placement plate 11 is flattened by means of polishing and, furthermore, is cleaned. In the cleaning, for example, the upper surface is defatted using an organic solvent such as acetone, isopropyl alcohol, or toluene and is then cleaned with warm water.

Figure 5A:
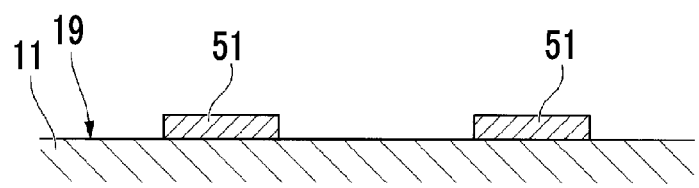
FIG. 5A illustrates a state in which a mask is formed in a method for forming protrusions provided in the electrostatic chuck device of the embodiment.

Next, as illustrated in FIG. 5A, a mask 51 having a predetermined pattern shape is formed on the placement surface 19. The pattern shape of the mask 51 is the same as the pattern of the protrusions 30 and the peripheral edge wall 17 in a plan view which is illustrated in FIG. 2. As the mask 51, a photosensitive resin or a plate-like mask is preferably used.

Figure 5B:
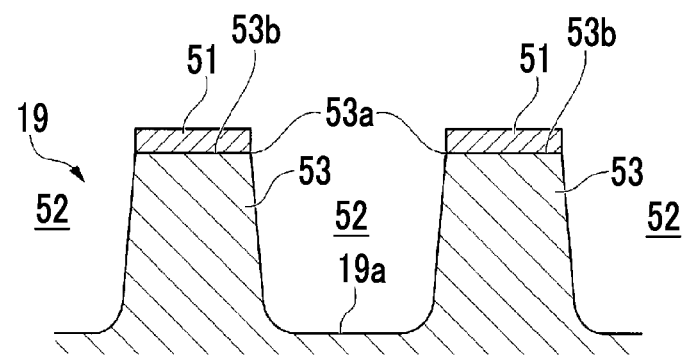
FIG. 5B illustrates a state after a sand blast step in the method for forming protrusions provided in the electrostatic chuck device of the embodiment.

Next, as illustrated in FIG. 5B, sand blast processing is carried out, and concave portions 52 are formed in parts that are not covered with the mask 51. As a result, parts covered with the mask 51 remain and form convex portions 53. The bottom 19a is formed on the bottom of the concave portions 52 between the convex portions 53.

Next, the mask 51 is removed. In a case in which the mask 51 is made of a photosensitive resin, the mask 51 can be removed using, for example, a peeling fluid such as methylene chloride.

Next, buffing is carried out on the entire placement surface 19 using fine abrasive grains and a buffing material. In addition, after the buffing, the placement surface 19 is cleaned. In the cleaning, the placement surface 19 is cleaned using an organic solvent such as acetone and is defatted. After the defatting, the placement surface is cleaned.

Figure 5C:
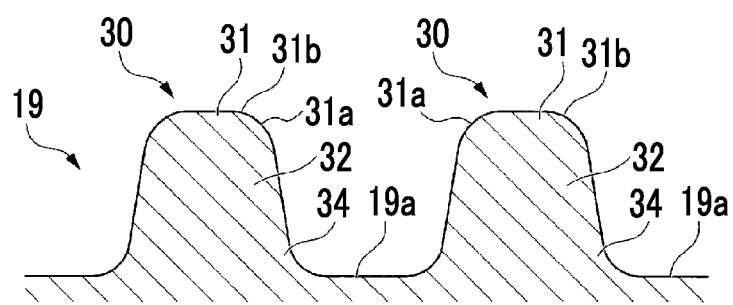
FIG. 5C illustrates a state in which the mask has been removed and buffing has been carried out in the method for forming protrusions provided in the electrostatic chuck device of the embodiment.

The buffing step turns the convex portions 53 on the placement surface 19 into the protrusions 30 as illustrated in FIG. 5C.

The sand blast step that is a preceding step is a step in which the surface of the placement surface 19 is damaged and parts on which the mask 51 is not formed are removed by means of excavation. Therefore, particularly, in the vicinity of corner portions 53a of the convex portions 53 formed by the sand blast step, surface layer cracks from the surface layer portion toward the inside remain. The surface layer cracks propagates due to a small stress and serve as starting points of peeling, and thus cause the generation of particles.

When buffing is carried out, the surface layer cracks formed in the sand blast step are forcibly propagated, peeled off, and removed. When peeling progresses from the surface layer cracks as starting points, the upper surfaces 53b and the corner portions 53a of the convex portions 53 become round, and, as illustrated in FIG. 5C, the smooth curved surfaces 31b and the corner surfaces 31a are formed.

In addition, buffing is carried out on the entire placement surface 19, whereby all of the protrusions 30 including the top surface 40 and the bottom 19a of the placement surface 19 can be polished at the same time. Therefore, the surface roughness Ra of the top surfaces 40 is set to 0.03 μm or less (more preferably 0.015 μm or less), and it is possible to provide a surface roughness corresponding to the surface roughness of the top surfaces 40 to the column portions 32 of the protrusions 30, the peripheral surfaces of the foot portions 34, and the bottom 19a. In the buffing step, the buffing material uniformly comes into contact with the top surfaces 40, but there are some parts on the bottom 19a which the buffing material does not easily reach, and thus there are cases in which the surface properties become partially coarse. The surface roughness Ra of the bottom 19a, including the above-described parts, can be set to 0.1 μm or less by means of the buffing step.

The conditions of the sand blast processing and the conditions of the buffing will be described.

Media that are used in the sand blast processing are preferably alumina, silicon carbide, glass beads, or the like, and the particle diameters of the media are preferably set to 400 meshes and under (media passing through 300 meshes).

The ejection pressure of the media in the sand blast processing is, for example, preferably set to 0.1 MPa or less and more preferably set to 0.05 MPa or less.

In the sandblast step of the related art, in consideration of the processing efficiency, the particle diameters of the media were set to 170 meshes and under, and the ejection pressure of the media was set to approximately 0.2 MPa. Compared with the related art, the sand blast step of the present embodiment is preferably carried out with decreased particle diameters of the media and controlled ejection pressures.

When the particle diameters of the media are decreased, and the ejection pressure of the media is set to 0.1 MPa or less (more preferably 0.05 MPa or less), it is possible to prevent the generation of surface layer cracks.

Surface layer cracks are removed by the buffing step; however, in a case in which it is considered that a large number of surface layer cracks are generated, the buffing step needs to be carried out carefully, and there is a concern that the slope of the column portion 32 may become great and the change in the cross-sectional area in the height direction may become great.

When the particle diameters of the media are decreased, and the ejection pressure of the media is set to 0.1 MPa or less (more preferably 0.05 MPa or less), it is possible to prevent the generation of surface layer cracks and simplify the buffing step. In such a case, the degree of the protrusions 30 polished during buffing is decreased. Therefore, it is possible to decrease the slope of the column portion 32. That is, the increase ratio of the cross-sectional area vertically downward from the top surface 40 of the protrusion 30 can be decreased.

As the fine abrasive grains that are used in the buffing, fine abrasive grains having a particle diameter of 0.125 μm or less are preferably used. In such a case, it is possible to carry out the polishing step under softer conditions and decrease the increase ratio of the cross-sectional area vertically downward from the top surface 40 of the protrusion 30. In addition, the buffing material is not particularly limited, and, for example, a resin buffing material can be used.

In the buffing, it is preferable to carry out polishing in multiple stages using fine abrasive grains that become finer as the stages progress. For example, it is preferable to carry out polishing in multiple stages, for example, carry out buffing sequentially using 800-mesh fine abrasive grains, 1,000-mesh fine abrasive grains, and 1,500-mesh fine abrasive grains.

According to the electrostatic chuck device 1 of the embodiment, even in a case in which the height H decreases in response to the abrasion of the protrusions 30, it is possible to prevent an increase in the contact area between the protrusions 30 and the plate-like specimen W. Therefore, it is possible to decrease the fluctuation in the thermal conduction characteristics of the protrusions 30 and the plate-like specimen W before and after abrasion, and it is possible to stably control the temperature of the plate-like specimen W.

EXAMPLES

Hereinafter, the present invention will be described in more detail using examples, but the present invention is not limited to these examples.

First, the electrostatic chuck portion 2 in which the protrusions 30 were not formed on the placement surface 19 was produced using a method of the related art.

The electrostatic adsorption internal electrode 13 having a thickness of approximately 10 μm was implanted in the electrostatic chuck portion 2. In addition, the placement plate 11 in the electrostatic chuck portion 2 was an aluminum oxide-silicon carbide composite sintered body containing 7.8% by mass of silicon carbide and had a disc shape having a diameter of 298 mm and a thickness of 0.5 mm.

In addition, the supporting plate 12 was also, similar to the placement plate 11, an aluminum oxide-silicon carbide composite sintered body containing 7.8% by mass of silicon carbide and had a disc shape having a diameter of 298 mm and a thickness of 2 mm. When the placement plate 11 and the supporting plate 12 were joined and integrated together, the total thickness of the electrostatic chuck portion 2 was set to 2.5 mm.

Next, the placement surface 19 that was the upper surface of the placement plate 11 was polished so as to produce a flat surface, and furthermore, the flat surface was cleaned.

Next, the mask 51 corresponding to the shapes of the protrusions 30 and the peripheral edge wall 17 was formed on the placement surface 19 (refer to FIG. 5A).

Next, sandblast processing was carried out, and the convex portions 53 and the concave portions 52 were formed (refer to FIG. 5B).

Next, the mask 51 was removed.

Next, buffing was carried out on the entire placement surface 19 using fine abrasive grains and a buffing material.

Next, the placement surface 19 was cleaned.

By means of the above-described steps, approximately 10,000 protrusions 30 were formed on the placement surface 19.

Examples 1 to 4 and a comparative example for which the conditions of the sand blast step and the buffing step were changed in the electrostatic chuck portion 2 formed by means of these steps were produced. The comparative example is a sample produced using the sand blast step and the buffing step which are generally carried out in the related art.

The conditions of the respective steps are shown in Table 1. In Table 1, the conditions in the examples are shown with the respective conditions in the comparative example set to 100%.

TABLE 1

|  | Sand blast step | | Buffing |
| --- | --- | --- | --- |
|  | Media size | Ejection pressure | Abrasive grain size |
| Comparative Example | 100% | 100% | 100% |
| Example 1 | 40% | 30% | 4% |
| Example 2 | 40% | 40% | 4% |
| Example 3 | 40% | 60% | 4% |
| Example 4 | 40% | 80% | 4% |

As a preliminary test, the electrostatic chuck device 1 was constituted using the electrostatic chuck portion 2 of Example 1, and cooling gas was caused to flow in a state in which, as the plate-like specimen W, a silicon wafer was adsorbed. The contact area between the protrusions 30 and the plate-like specimen W in this state was confirmed. Therefore, it was confirmed that, in the front end portion 31 of the protrusion 30, a region that was located from the apex 41 to a distance 0.4 μm vertically downward therefrom was formed as the contact region (that is, the top surface 40).

In the following test results, the top surface 40 of the protrusion 30 was considered as a region that was located from the apex 41 of the protrusion 30 to a distance 0.4 μm vertically downward therefrom and was observed.

Figure 6:
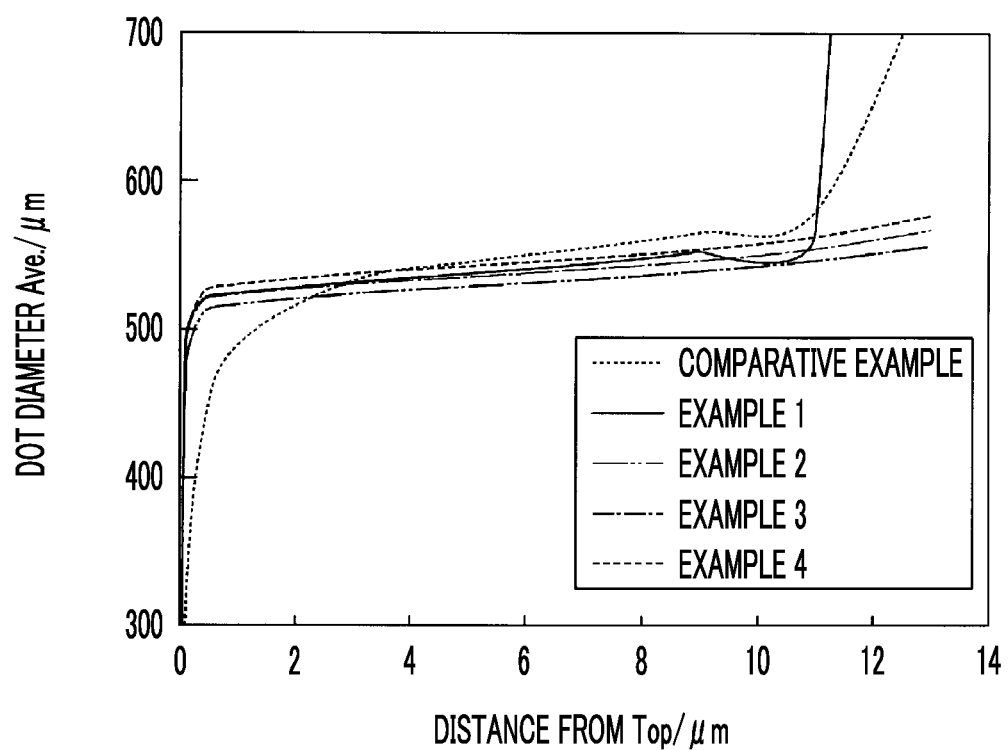
FIG. 6 is a graph showing the measurement results of the shapes of protrusions in examples and a comparative example.

The measurement results of the shapes of the protrusions 30 of Examples 1 to 4 and the comparative example are shown in Table 2 and FIG. 6. The shapes of the protrusions 30 at predetermined positions formed on the placement surface 19 were measured at a plurality of points from the center toward the outer circumference.

In FIG. 6, the horizontal axis indicates the values of the protrusions 30 in the height direction, and the vertical axis indicates the values of the protrusions 30 in the radius direction.

TABLE 2

| Measurement point | | Ratio of cross-sectional area to cross-sectional area of lower end of top surface [%] | | | | |
|---|---|---|---|---|---|---|
| | | Comparative Example | Example 1 | Example 2 | Example 3 | Example 4 |
| Apex | −0.4 | — | — | — | — | — |
| | −0.3 | — | — | — | — | — |
| Lower end of top surface | 0 | 100.0 | 100.0 | 100.0 | 100.0 | 100.0 |
| | 0.6 | 129.0 | 101.6 | 102.3 | 101.7 | 102.1 |
| | 2.6 | 152.8 | 104.4 | 105.2 | 104.4 | 104.9 |
| | 4.6 | 160.0 | 106.8 | 107.2 | 106.3 | 106.9 |
| Approximately ½ of height | 6.6 | 165.6 | 109.4 | 109.2 | 108.4 | 109.0 |
| | 8.6 | 172.1 | 112.9 | 111.6 | 110.8 | 111.5 |
| | 10.6 | 181.1 | 119.0 | 114.5 | 114.1 | 115.0 |
| | 12.6 | 298.3 | 1977.6 | 118.8 | 119.4 | 121.0 |

As illustrated in Table 2 and FIG. 6, in the protrusion 30 of the comparative example, it was confirmed that the cross-sectional area increased to a significant extent vertically downward from the lower end 40a of the top surface 40. In contrast, in the protrusions 30 of Examples 1 to 4, it was confirmed that the cross-sectional areas increased to a decreased extent.

Next, for the samples of Examples 1 to 3, the upper surfaces of the peripheral edge walls 17 corresponding to the top surface 40 of the protrusion 30 were measured. The measurements were carried out at four places on the peripheral edge walls 17, and the measurement results were averaged.

The peripheral edge walls 17 were formed in the same manufacturing order as the protrusion 30, and the measurement results of the surface roughness of the upper surfaces of the peripheral edge walls 17 can be replaced with the surface roughness of the top surface 40 of the protrusion 30.

TABLE 3

| | Surface roughness Ra (μm) |
|---|---|
| Example 1 | 0.010 |
| Example 2 | 0.009 |
| Example 3 | 0.008 |

As shown in Table 3, the surface roughness Ra of the upper surfaces of the peripheral edge walls 17 of Examples 1 to 3 were 0.010 μm or less. From this result, it is assumed that the top surfaces 40 of the protrusions 30 of Examples 1 to 3 also had the same surface roughness Ra. In the measurement, the surface roughness of Example 4 was not measured, but is assumed to be the same.

As described above, it was confirmed that the electrostatic chuck portions 2 of the electrostatic chuck devices 1 corresponding to the embodiment could be produced as Examples 1 to 4.

Hitherto, a variety of embodiments of the present invention have been described, but the respective constitutions, combinations thereof, and the like in the respective embodiments are simply examples, and addition, omission, substitution, and other modification of the constitution are allowed within the scope of the gist of the present invention. In addition, the present invention is not limited by the embodiments.

INDUSTRIAL APPLICABILITY

It is possible to provide an electrostatic chuck device capable of further decreasing the temporal change in thermal conduction characteristics.

REFERENCE SIGNS LIST

1 ELECTROSTATIC CHUCK DEVICE
2 ELECTROSTATIC CHUCK PORTION
3 COOLING BASE PORTION
4, 6 ADHESIVE MATERIAL
5 HEATER ELEMENT
7 INSULATING MEMBER
8 RESIN LAYER
11 PLACEMENT PLATE
12 SUPPORTING PLATE
13 ELECTROSTATIC ADSORPTION INTERNAL ELECTRODE
14 INSULATING MATERIAL LAYER
15, 22 POWER FEEDING TERMINAL
17 PERIPHERAL EDGE WALL
18 COOLING GAS INTRODUCTION HOLE
19 PLACEMENT SURFACE
19a BOTTOM
23 INSULATOR
30, 130 PROTRUSION
31, 131 FRONT END PORTION
31a CORNER SURFACE
31b SMOOTH CURVED SURFACE
32 COLUMN PORTION
34 FOOT PORTION
40, 140 TOP SURFACE
40a, 140a LOWER END
41 APEX
51 MASK
52 CONCAVE PORTION
53 CONVEX PORTION
53a CORNER PORTION
53b UPPER SURFACE
W PLATE-LIKE SPECIMEN

The invention claimed is:

1. An electrostatic chuck device that adsorbs a plate-like specimen with an electrostatic adsorption electrode and cools the plate-like specimen, comprising:
an electrostatic chuck portion, a forming material of which is a ceramic sintered body, and that has one main surface that is a placement surface on which the plate-like specimen is placed,
wherein a plurality of protrusions supporting the plate-like specimen are provided on the placement surface,
wherein the protrusion has a top surface that is in contact with the plate-like specimen and supports the plate-like specimen, and has a cross-sectional area that gradually increases vertically downward from a height position of the top surface,
wherein a cross-sectional area at a distance 0.6 μm vertically downward from a lower end of the top surface of the protrusion is 110% or less of a cross-sectional area of a lower end of the top surface, and
wherein the top surface has a surface roughness Ra of 0.1 µm or less.

2. The electrostatic chuck device according to claim 1, wherein a cross-sectional area at a distance 2.6 µm vertically downward from a lower end of the top surface of the protrusion is 120% or less of a cross-sectional area of a lower end of the top surface.

3. The electrostatic chuck device according to claim 1, wherein the protrusion has a height that is 6 µm or more and 50 µm or less, and a cross-sectional area at a height of ½ of the protrusion is 140% or less of a cross-sectional area of a lower end of the top surface.

4. The electrostatic chuck device according to claim 1, wherein the top surface of the protrusion is a region that is located from an apex of the protrusion to a distance 0.4 µm vertically downward therefrom.

5. The electrostatic chuck device according to claim 1, wherein the placement surface includes an aluminum oxide-silicon carbide composite sintered body, an aluminum oxide sintered body, an aluminum nitride sintered body, or an yttrium oxide sintered body.

6. The electrostatic chuck device according to claim 1, wherein a surface roughness Ra of a bottom on which the protrusion is not formed on the placement surface is 1.0 µm or less.

7. The electrostatic chuck device according to claim 1, wherein a ratio of the sum of cross-sectional areas in lower ends of a plurality of the top surfaces with respect to an area of the placement surface in a plan view is 0.1% or more and 20% or less.

\* \* \* \* \*